United States Patent [19]

Turin

[11] Patent Number: 5,258,627

[45] Date of Patent: Nov. 2, 1993

[54] SEMICONDUCTOR STRUCTURE USING PROTEIN AS ITS ACTIVE ELEMENT

[75] Inventor: Luca Turin, Carrboro, N.C.

[73] Assignee: The United States of America as represented by the Secretary of the Department of Health & Human Services, Washington, D.C.

[21] Appl. No.: 802,305

[22] Filed: Dec. 4, 1991

[51] Int. Cl.⁵ .............................. H01L 29/28
[52] U.S. Cl. .......................... 257/40; 257/48; 257/471; 257/734; 437/1
[58] Field of Search .......... 257/40, 48, 4, 471, 257/480, 734, 741; 437/1, 8, 175; 435/4, 22; 324/158 D; 427/10; 436/806, 525

[56] References Cited

U.S. PATENT DOCUMENTS

| 2,734,154 | 2/1956 | Pankove | 257/415 |
| 4,054,646 | 10/1977 | Giaever | 435/5 |
| 4,318,784 | 3/1982 | Higgins et al. | 204/73 R |
| 4,859,538 | 8/1989 | Ribi | 435/4 |
| 4,902,555 | 2/1990 | Isoda et al. | 257/296 |

FOREIGN PATENT DOCUMENTS

| 0285248 | 10/1988 | European Pat. Off. | 437/1 |
| 3-225872 | 10/1991 | Japan | 257/40 |

Primary Examiner—Sara W. Crane
Attorney, Agent, or Firm—Cushman, Darby & Cushman

[57] ABSTRACT

A method and apparatus of testing semiconductor properties of a protein. Mercury electrodes are formed in an aqueous solution of protein and protein is adsorbed of the surface of the mercury electrodes. The electrical properties of the protein adsorbed thereon can be determined by applying current and voltage thereto.

31 Claims, 4 Drawing Sheets

SEMICONDUCTOR STRUCTURE USING PROTEIN AS ITS ACTIVE ELEMENT

FIELD OF THE INVENTION

The present invention defines a semiconductor device which uses protein as its active semiconducting element.

BACKGROUND AND SUMMARY OF THE INVENTION

Proteins have long been postulated to have semiconductor properties. Using proteins as a semiconductor would be exciting due to their ready availability and the possibility of forming them in a very thin (e.g. monomolecular or bi-molecular) layer. However, the electrical properties of such proteins have proven very difficult to measure due to the very properties of proteins which make them exciting.

Specifically, it is very difficult to apply a current across a monomolecular protein layer and measure its characteristics. Prior to the present invention, there has been no stable way, therefore, of applying current to a protein and measuring its semiconductor characteristics.

One previous attempt to measure the semiconductor characteristics of protein within the personal knowledge of the inventor of this invention has used microscopic samples of dried protein. This attempt has detected virtually no conduction. Another attempt used proteins adsorbed on a single metal surface immersed in a solution. The current in this solution was carried by the reduction of a hydrogen ion and was, therefore, not purely electronic. These two attempts have therefore proved severely deficient.

Another attempt can be found in U.S. Pat. No. 4,902,555. This technique uses proteins in a protein transport situation where it can accept and donate electrons. The inventors of '555 stated that they used the electron transfer proteins from an organism to provide a transistor characteristic. However, they totally ignored the metal/protein junction in their device. This junction has proved to be one of the most difficult to properly fabricate, and is a main advantage of the present invention. It is doubtful whether this device could actually work because any roughness in the metal would be expected to pierce the protein layer. The FIG. 6 embodiment used metal electrodes of silver, gold or aluminum, and placed the electron transfer protein on the substrate.

The '555 patent teaches that the film of protein molecules is formed according to a Langmuir Blodgett technique, but there is no suggestion as to how this protein layer would be connected. Moreover, the way in which an aqueous environment would be maintained is at best speculative.

Other techniques have been used to form semiconductor devices in liquid environments. For instance, U.S. Pat. No. 2,734,154, teaches a semiconductor material where the conducting metal used to conduct current to and from the semiconductor is mercury. There is nothing, however, teaching that this could be used in combination with any protein.

The present invention is intended to obviate all of these problems, and defines a semiconductor device and method of forming and testing such a semiconductor device which uses protein as its active element. The device includes a containing structure which contains a liquid, with first and second liquid metal electrode drops within the space. A protein layer is adsorbed to at least one of the liquid metal electrodes, and sandwiched therebetween. An electrically connecting means connects to the first an second liquid metal electrode drops. The metal preferably includes mercury, and the electrodes are preferably in contact with and bounded by the interior walls. The container is preferably a tubing which is bent into a "U-shape" to contain the liquid in a center portion thereof.

A similar technique is also disclosed for forming a semiconductor test set which uses a protein-containing semiconductor device as discussed above, and a test set which applies a signal between the electrodes and measures a response. A method of making such a semiconductor is also disclosed. This method includes filling an open end container with a biological protein and inserting first and second liquid metal electrodes of a type to which the biological protein will adsorb into the container. The first and second electrodes are positioned adjacent one another with a biological protein therebetween and adsorbed to at least one of the electrodes. A method of testing such a biological semiconductor is similarly disclosed.

BRIEF DESCRIPTION OF THE DRAWINGS

These and other aspects of the present invention will now be described in detail with reference to the accompanying drawings, in which.

DESCRIPTION OF THE PREFERRED EMBODIMENT

Figure 1:
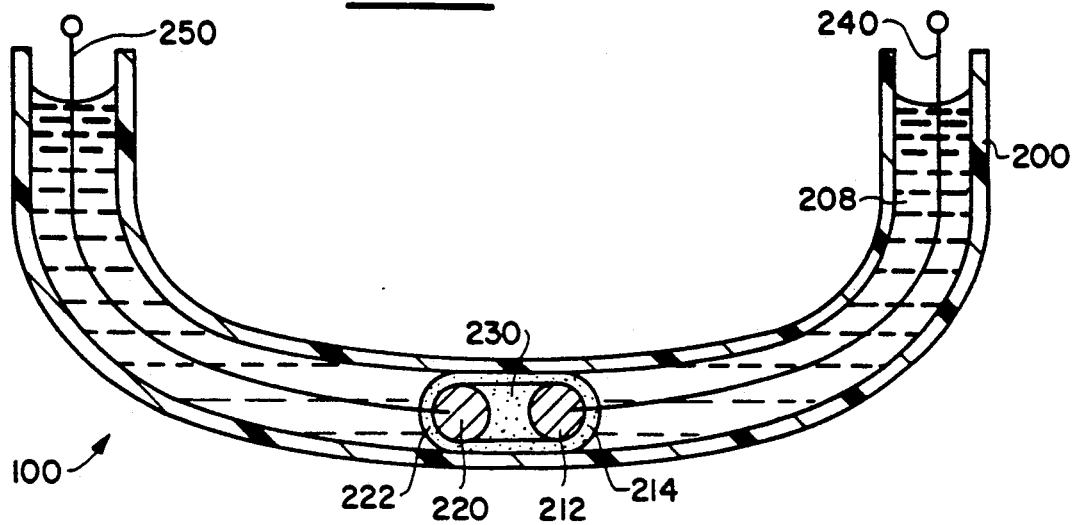
FIG. 1 shows a cross-sectional structure of a first embodiment of the present invention.
Figure 2:
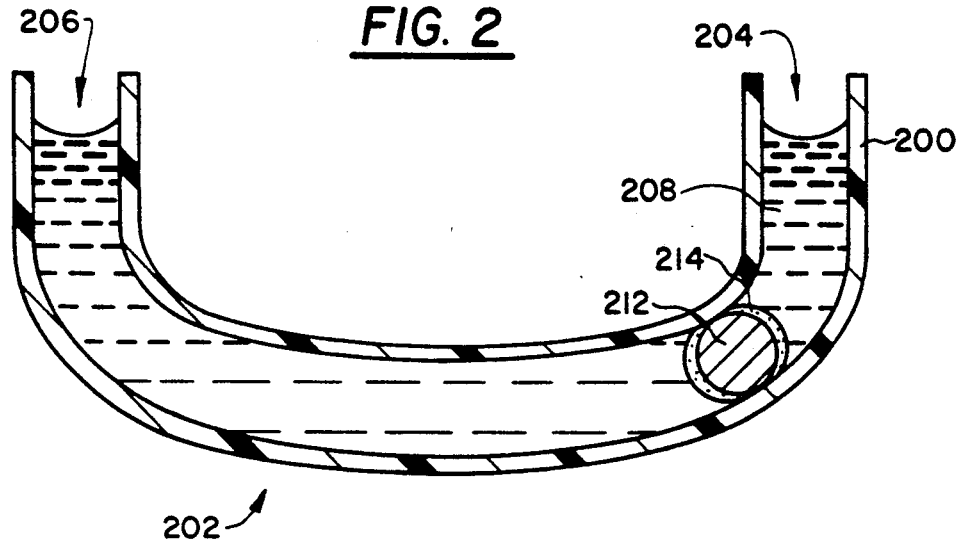
FIG. 2 shows a cross-sectional view of this structure with only a first drop in place.

The present invention defines elements of a semiconductor structure formed using a protein material preferably contained in a liquid solution which in the preferred embodiment is an aqueous solution. The first embodiment of this device is shown in FIG. 1, and the formation of this device will be described with reference to FIGS. 2 and 3. In FIG. 2, tube 200, which is preferably formed of synthetic rubber or the like, is bent into a U-shape such that the center portion 202 is a containing portion that can hold a liquid material therein which will not overflow from either of the end portions 204 or 206. An aqueous solution 208 including a protein therein is filled into the center section 202 of the tube 200. The protein used is preferably bovine serum albumen which is readily available and is relatively cheap.

A first droplet 212 of mercury, which will form the first electrode of the resultant device, is dropped into the U-shaped tubing from end 204. The droplet 212 sinks to a bottom portion of the U-shape, where after a few moments the proteins in the aqueous solution adsorb to the exposed surfaces of the mercury electrode, to form a monolayer of protein 214 around this electrode. The proteins in the aqueous solution adsorb to the liquid mercury, and the protein monolayer thus formed maintain, at least to some extent, the integrity of the mercury droplet shape. Since mercury is atomically smooth and very flexible, the integrity of the protein layer 214 is also maintained. This protein layer would otherwise be pierced, for example, by liquid or solid metal contacts.

Figure 3:
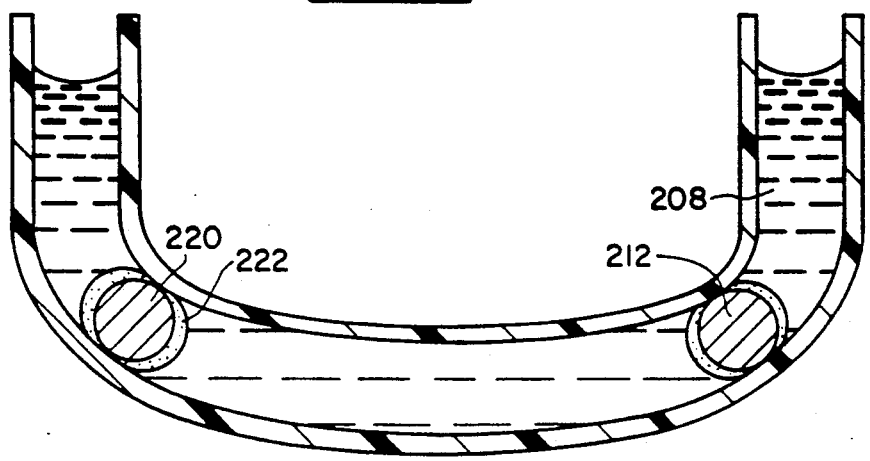
FIG. 3 shows a second drop in place in the FIG. 2 embodiment.

FIG. 3 shows the next step in the process where a second drop 220 is deposited from the other side 206 into the aqueous solution 208, and similarly receives an adsorbed layer 222 thereon.

The two coated mercury drops 212 and 220 are then brought into position at the bottom of the U by tapping or the like. FIG. 1 shows the two mercury drops 212 and 220 brought into position at the bottom of the U. The protein layer covering the mercury drops 212 and 220 keeps the two drops from coalescing together, and forms a mercury/protein/mercury sandwich. The protein layer section 230 between the mercury drops 212 and 220 can be a monolayer of protein if the drops can be brought tightly into contact with one another, or a bilayer of the protein which is formed by the two layers 214 and 222.

FIG. 1 also shows the final step in the process, which includes inserting platinum or iron wires 240 and 250 through respective ends 204 and 206 of the container into the respective meniscus of the mercury drops. In this way, the wires form an electrical connection with the respective mercury drops between which an electrical signal can be fed.

Figure 4:
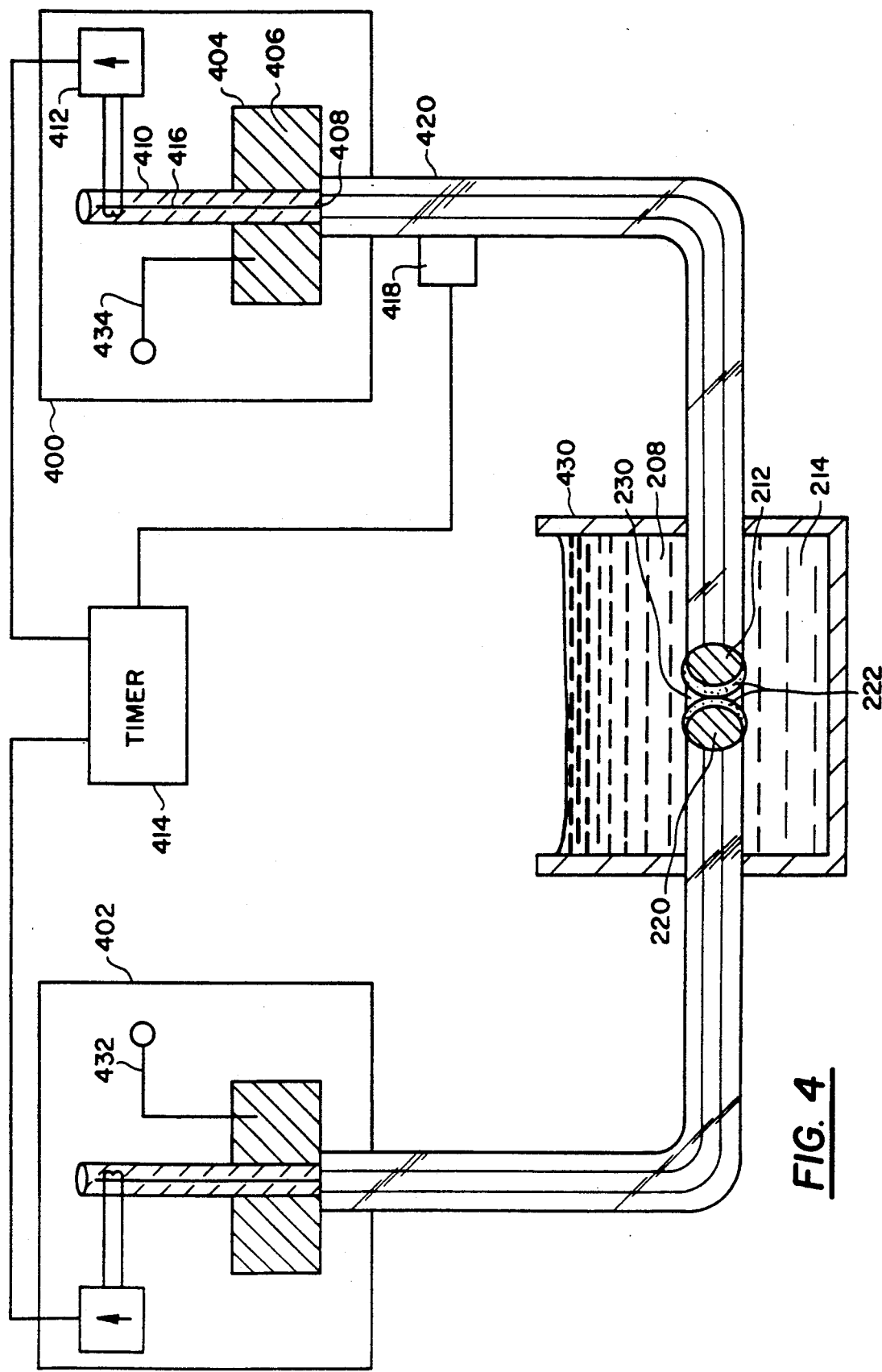
FIG. 4 shows a second embodiment of the invention.

FIG. 4 shows a second embodiment of the device of the present invention. This second embodiment uses a dropping mercury electrode polarograph to produce mercury droplets which are renewable at intervals to avoid the aging problem discussed above. This embodiment uses two mercury polarographs 400 and 402. These devices ar readily available off-the-shelf items from a number of different vendors, but also can be made using available equipment as shown. The simplest way to make this would be to start with a container 404 within which a bath of mercury material 406 is located. A hole 408 is located in the bottom of the container, and a solenoid needle valve 410 is placed into the hole. Many types of appropriate needle valves can be purchased, for example, from Cole Parmer, Chicago, Ill. The actuator 412 of the solenoid needle valve is connected to a timer 414. When the timer produces an output signal, this output signal actuates the actuator, causing the needle element 416 of the needle valve to move upward. The amount by which the needle moves upwards is controllable within the actuator 412. The needle moving upward causes a predetermined amount corresponding to a particular drop size of mercury to escape through the bottom hole 408.

A glass capillary tube 420 is connected to the bottom of the dropping mercury electrode polarograph which then connects into a second container 430 in which an aqueous solution 208 of protein is located. The protein droplets are shown numbered the same as in FIGS. 1-3, with one of the mercury droplets produced by polarograph 400 and the other produced by polarograph 402. Each device might also include a tapper 418 which essentially taps the mercury drop to help it escape.

The timer 414 can be any commercially available timer, and only need provide a pulse to each of the actuators 412 at each unit time. The timing of the tapper can also be controlled by timer 414.

The structure of FIG. 4 can be advantageous since it allows the mercury drop to be replenished at various intervals say 1 per second. Electrical leads 432, 434 are in the proper locations, and accordingly allow electrical conductance across the new mercury droplets with proteins located thereon. This allows them to be periodically tested without the results of aging discussed above and herein.

Figure 5:
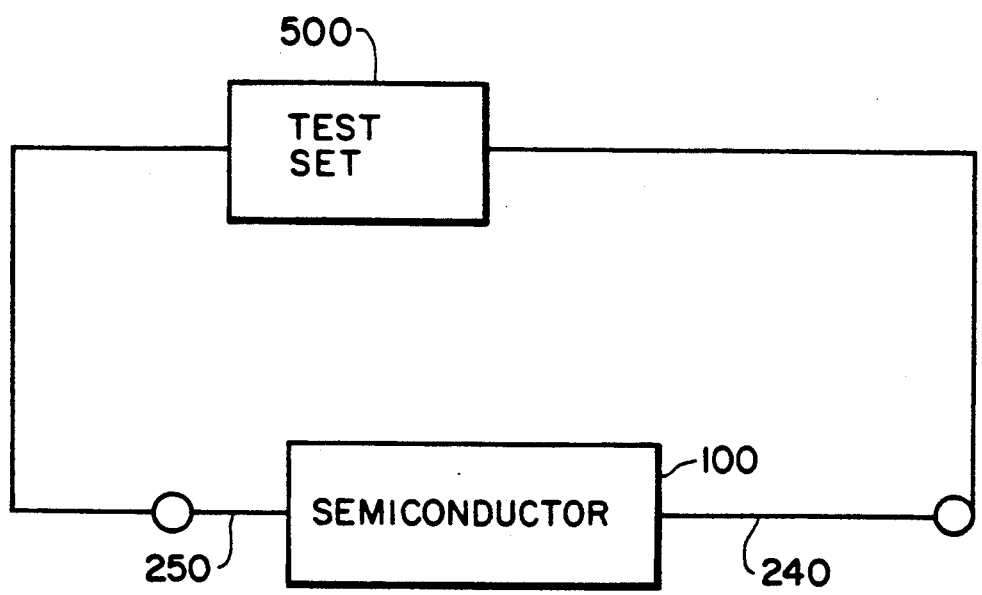
FIG. 5 shows a test set according to the present invention.

FIG. 5 shows a test set used according to the present invention to evaluate the electrical properties of the resultant semiconductor 100. FIG. 4 shows the FIG. 1 semiconductor 100 as a block form, but shows connection to the respective two electrodes 240 and 250. The test set 500 in FIG. 5 is preferably a signal generating and measurement device but could be no more complicated than a voltmeter and series ammeter. It could also be much more complicated; including a frequency generator and an oscilloscope or spectrum analyzer.

The resultant mercury/protein/mercury sandwich is typically stable for at least many hours, and more likely, many days. It withstands vibration, repeated voltage cycles of $+/-$ volts, and temperature cycles between zero and 40°. The preferred embodiment of the invention uses pure mercury as both electrodes, and the device then behaves as back-to-back diodes in series as shown in the bottom curve in FIG. 6. The electrical conductance and capacitance of the device become maximum at zero volts, and fall on either side of both positive and negative voltages.

An alternate embodiment dopes one of the two mercury drops with an impurity. This embodiment forms the second drop of a 1-1.5% amalgam of zinc in mercury. This amalgam is obtained by directly dissolving zinc dust in mercury at room temperature. The other drop is pure mercury. The resultant device operates as shown in the top curve of FIG. 6, like a standard diode, where conductance increases in the forward direction, and is very low in the backward direction.

Figure 6:
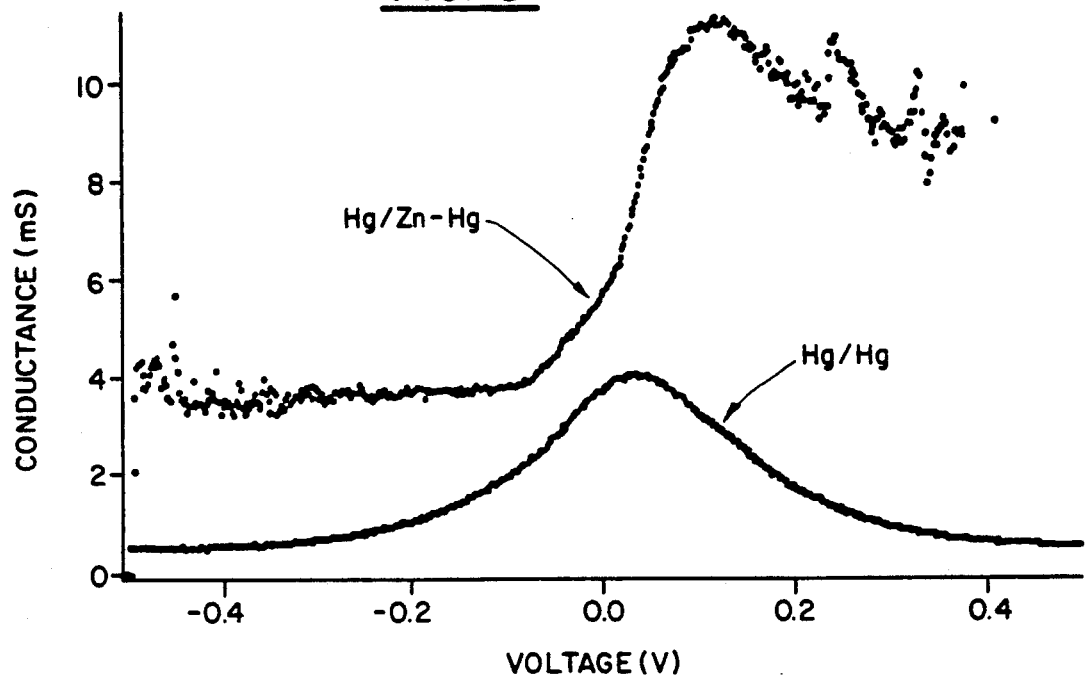
FIGS. 6 and 7 show experimental results using the FIG. 1 embodiment.

The FIG. 6 curves are conductance/voltage relationship for 1 milligram/milliliter amylase between symmetric mercury/mercury electrode and an asymmetric mercury/mercury-zinc configuration, respectively. A conductance/voltage curve consistent with two back-to-back diodes is obtained from the mercury/mercury electrode configuration. The mercury/mercury-zinc configuration obtains a unidirectional rectification in which series and leakage conductances are large.

The resultant structure is strongly temperature dependent, and falls by a factor of 2-3 when temperature is lowered from 22° to 0° C. This is consistent with thermally activated electron movement. It is postulated by the inventor that pure mercury forms a rectifying contact with protein while zinc forms an ohmic contact. Diode leakage and series resistance are both high, but very wide variation is obtained.

Figure 7:
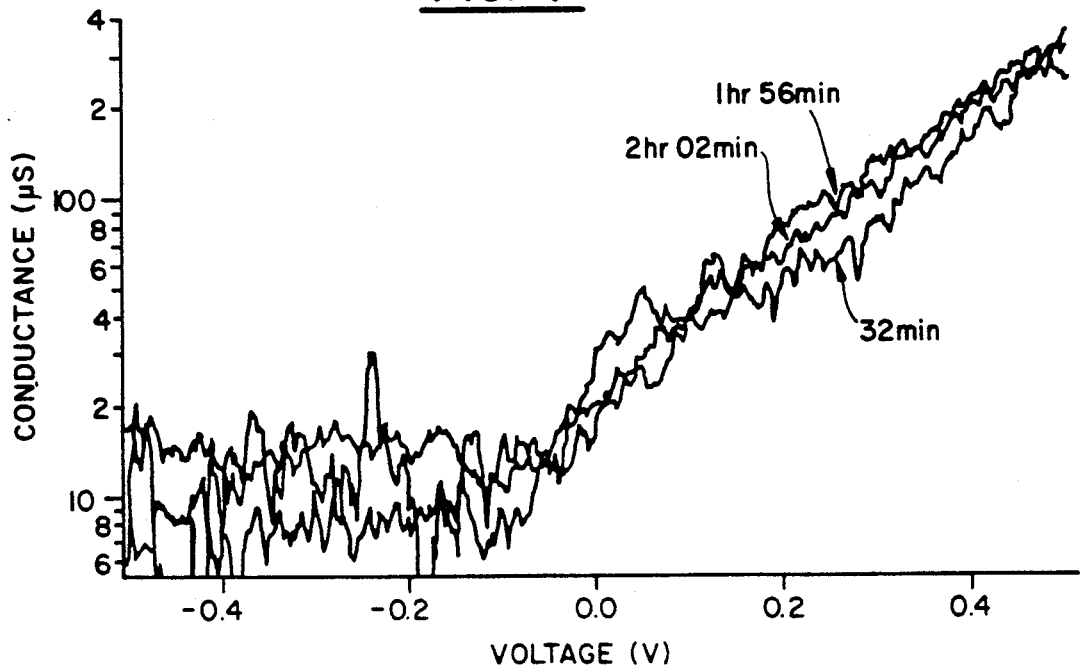

FIG. 7 shows the conductance/voltage relationship for bovine serum albumen in an asymmetric configuration. The times noted on the chart indicate time elapsed since device formation.

Although only a few embodiments have been disclosed in detail above, those of skill in the art recognize that many modifications are possible in these embodiments without departing from the teachings hereof.

Although the present invention specifies use with mercury or mercury/zinc electrodes, it is postulated that any liquid metal which has a molecularly smooth surface could be used, and that any mercury containing metal could also be used. Any protein of a similar type could be used, and any container which allows connection with two droplets could be used.

What is claimed is:

1. A semiconductor device using a protein as its active element, comprising:
   means for containing a liquid, having interior walls defining a space therein;
   a first electrode formed of a first liquid metal, within said space in said containing means;
   a second electrode formed of a second liquid metal, within said space in said containing means; and
   a protein layer, adsorbed to at least one of said first and second liquid metal electrodes and sandwiched therebetween.

2. A semiconductor device as in claim 1, further comprising means for electrically connecting to said first and second liquid metal electrodes.

3. A semiconductor device as in claim 1, wherein said first and second liquid metals are metals including mercury and are formed by a drop of the liquid metal.

4. A semiconductor device as in claim 2, wherein said first and second electrodes are in contact with and bounded by said interior walls and form a meniscus between said interior walls through which said connecting means is attached.

5. A semiconductor device as in claim 3, wherein said containing means is a tubing bent into a U-shape.

6. A semiconductor device as in claim 3, wherein said electrically connecting means are wires penetrating a meniscus of each said drop and in electrical contact with said first and second electrodes.

7. A semiconductor device as in claim 5, wherein said wires are formed of a metal from the group consisting of iron or platinum.

8. A semiconductor device as in claim I, wherein said protein layer is a protein including albumen.

9. A semiconductor device as in claim 3, wherein at least one of said electrodes is doped with an impurity.

10. A semiconductor device as in claim 3, wherein said impurity is zinc.

11. A semiconductor test set for testing semiconductor properties of protein, comprising:
    means for containing a liquid including a protein, having interior walls defining a space therein;
    a first electrode formed of a first liquid metal, within said space in said containing means;
    a second electrode formed of a second liquid metal, within said space in said containing
    a protein layer, adsorbed to at least one of said first and second liquid metal electrodes and sandwiched therebetween; and
    means for applying a signal between said electrodes and measuring a response thereto.

12. A semiconductor device as in claim 11, further comprising means for electrically connecting to said first and second liquid metal electrodes.

13. A semiconductor device as in claim 11, wherein said first and second liquid metals are metals including mercury and are formed by a drop of the liquid metal.

14. A semiconductor device as in claim 12, wherein said first and second electrodes are in contact with and bounded by said interior walls and form a meniscus between said interior walls through which said connecting means is attached.

15. A semiconductor device as in claim 13, wherein said containing means is a tubing bent into a U-shape.

16. A semiconductor device as in claim 13, wherein said electrically connecting means are wires penetrating a meniscus of each said drop and in electrical contact with said first and second electrodes.

17. A semiconductor device as in claim 15, wherein said wires are formed of platinum.

18. A semiconductor device as in claim 11, wherein said protein layer is a protein including albumen.

19. A semiconductor device as in claim 13, wherein at least one of said electrodes is doped with an impurity.

20. A semiconductor device as in claim 13, wherein said impurity is zinc.

21. A method of making a biological semiconductor, comprising the steps of:
    filling an open-end container with a biological protein;
    inserting first and second liquid metal electrodes, of a type to which said biological protein will adsorb, into said container; and
    positioning said first and second electrodes adjacent one another with said biological protein therebetween and adsorbed to at least one of said electrodes.

22. A method as in claim 21, wherein said first and second liquid metals ar metals including mercury and are formed by a drop of the liquid metal.

23. A method as in claim 22, wherein at least one of said metals is an amalgam of zinc in mercury.

24. A method as in claim 23, wherein said at least one metal is formed by directly dissolving zinc dust in mercury.

25. A method as in claim 21, wherein said open end container is a tube bent into a U-shape.

26. A method as in claim 21, wherein said inserting first metal electrodes comprises the steps of:
    using a dropping mercury electrode polargraph to insert said first and second liquid metal electrodes.

27. A method as in claim 26, further comprising periodically dropping new mercury droplets into said container.

28. A method of testing a biological semiconductor, comprising the steps of:
    filling an open-end container with a biological protein;
    inserting first and second liquid metal electrodes, of a type to which said biological protein will adsorb, into said container;
    positioning said first and second electrodes adjacent one another with said biological protein therebetween and adsorbed to at least one of said electrodes; and
    measuring semiconductor characteristics of said first and second electrodes with said biological protein therebetween.

29. A semiconductor device using a protein as its active element, comprising:
    means for containing a liquid, having interior walls defining a space therein;
    a first liquid metal electrode, within said space in said containing means;
    a second liquid metal electrode, within said space in said containing means; and
    a protein layer adsorbed to at least one of said first and second liquid metal electrodes and sandwiched therebetween.

30. A method as in claim 21, wherein said inserting first metal electrodes comprises the steps of:
    using a dropping mercury electrode polargraph to insert said first and second liquid metal electrodes.

31. A method as in claim 26, further comprising periodically dropping new mercury droplets into said container.

* * * * *